(12) United States Patent
Fantini et al.

(10) Patent No.: US 11,158,673 B2
(45) Date of Patent: Oct. 26, 2021

(54) VERTICAL 3D MEMORY DEVICE AND METHOD FOR MANUFACTURING THE SAME

(71) Applicant: Micron Technology, Inc., Boise, ID (US)

(72) Inventors: Paolo Fantini, Vimercate (IT); Corrado Villa, Sovico (IT); Paolo Tessariol, Arcore (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/771,658

(22) PCT Filed: Dec. 18, 2019

(86) PCT No.: PCT/IB2019/001256
§ 371 (c)(1),
(2) Date: Jun. 10, 2020

(87) PCT Pub. No.: WO2021/123852
PCT Pub. Date: Jun. 24, 2021

(65) Prior Publication Data
US 2021/0225938 A1    Jul. 22, 2021

(51) Int. Cl.
*G11C 16/04*    (2006.01)
*H01L 27/24*    (2006.01)
*G11C 8/08*    (2006.01)

(52) U.S. Cl.
CPC ............ *H01L 27/2481* (2013.01); *G11C 8/08* (2013.01)

(58) Field of Classification Search
CPC ........ H01L 27/2481; G11C 8/08; G11C 16/04
USPC ........................................ 365/185.01–185.33
See application file for complete search history.

(56) References Cited

U.S. PATENT DOCUMENTS

| | | | |
|---|---|---|---|
| 2017/0236746 A1* | 8/2017 | Yu ................. | H01L 27/11582 257/314 |
| 2017/0243650 A1* | 8/2017 | Ogawa ............. | H01L 27/11556 |
| 2019/0229125 A1* | 7/2019 | Zhou ............... | H01L 27/11556 |

* cited by examiner

*Primary Examiner* — Harry W Byrne
(74) *Attorney, Agent, or Firm* — Holland & Hart LLP

(57) ABSTRACT

A vertical 3D memory device may comprise: a substrate including a plurality of conductive contacts each coupled with a respective one of a plurality of digit lines; a plurality of word line plates separated from one another with respective dielectric layers on the substrate, the plurality of word line plates including at least a first set of word lines separated from at least a second set of word lines with a dielectric material extending in a serpentine shape and at least a third set of word lines separated from at least a fourth set of word lines with a dielectric material extending in a serpentine shape; at least one separation layer separating the first set of word lines and the second set of word lines from the third set of word lines and the fourth set of word lines, wherein the at least one separation layer is parallel to both a digit line and a word line; and a plurality of storage elements each formed in a respective one of a plurality of recesses such that a respective storage element is surrounded by a respective word line, a respective digit line, respective dielectric layers, and a conformal material formed on a sidewall of a word line facing a digit line.

20 Claims, 25 Drawing Sheets

VERTICAL 3D MEMORY DEVICE AND METHOD FOR MANUFACTURING THE SAME

CROSS REFERENCE

The present application for patent is a 371 national phase filing of and claims priority to and the benefit of International Patent Application No. PCT/IB2019/001256 to Fantini et al., titled "VERTICAL 3D MEMORY DEVICE AND METHOD FOR MANUFACTURING THE SAME," filed Dec. 18, 2019, assigned to the assignee hereof, which is expressly incorporated herein by reference in its entirety.

DESCRIPTION

Technical Field

The following relates generally to a memory array that includes at least one memory cell and more specifically to a vertical 3D (three dimensional) memory device and method for manufacturing the same.

Background Art

Memory devices are widely used to store information in various electronic devices such as computers, wireless communication devices, cameras, digital displays, and the like.

Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RANI (SDRAM), ferroelectric RANI (FeRAM), magnetic RAM (MRAM), resistive RANI (RRAM), flash memory, phase change memory (PCM), other chalcogenide-based memories, and others. Memory devices may be volatile or non-volatile.

Improving memory devices, generally, may include increasing memory cell density, increasing read/write speed, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

DETAILED DESCRIPTION

Figure 1:
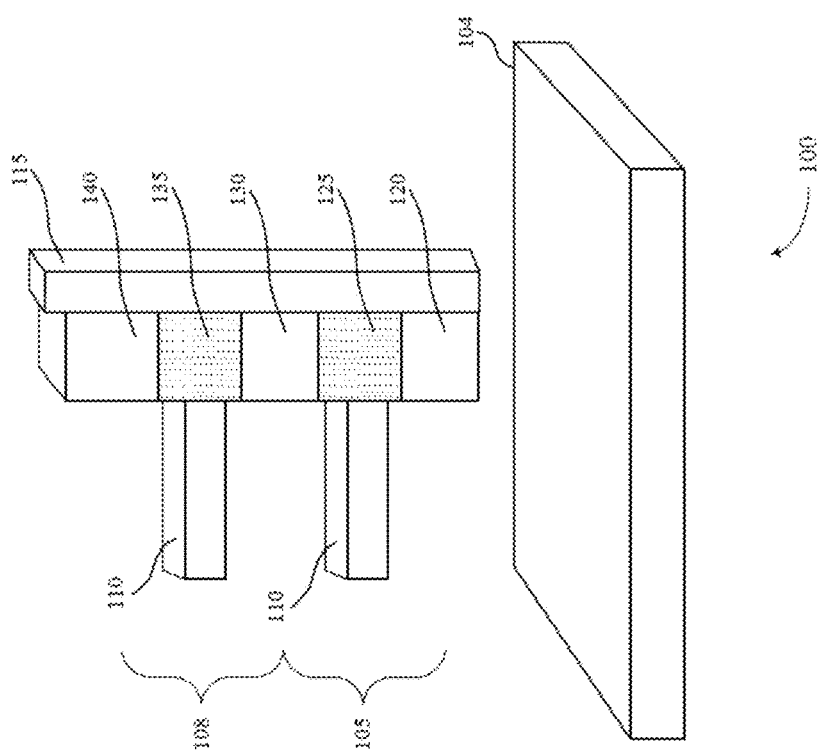
FIG. 1 illustrates an example of a vertical 3D memory array in accordance with examples as disclosed herein.

The present disclosure relates to three-dimensional (3D) vertical self-selecting memory arrays with an increased density of memory cells and a reduced power consumption, and methods of manufacturing the same. The memory arrays may include an arrangement of conductive contacts and openings through alternative layers of conductive materials and insulative material that may decrease the spacing between the memory cells while maintaining a dielectric thickness to sustain the voltage to be applied to the memory array.

In some examples, a 3D memory array may include a substrate with a plurality of contacts arranged in a pattern (e.g., a geometric pattern) and a first insulative material (e.g., a dielectric material) formed on the substrate. A plurality of planes of a conductive material may be separated from one another by a second insulative material (e.g., a dielectric material) and formed on the substrate material. The planes of conductive material may be examples of word lines.

During manufacturing of such a memory array, a trench may be formed in a shape that separates odd and even WL line planes to create "comb" structures (e.g., structures that look like a tool with fingers and space between the fingers). The trench may have any geometric configuration and include odd and even groups of fingers of the comb facing one another at a fixed distance. In some examples, the trench may be formed in a serpentine shape. The trench may divide each plane of conductive material into two sections or two plates. Each place of conductive material may be an example of a word line plate. In some examples, inside the trench, the planes of the conductive material may be etched in such a way that the dielectric materials and the conductive materials form a plurality of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer. The sacrificial layer and the insulative layer may form a serpentine shape. In some examples, other geometric configurations of the trench are contemplated. In some examples, at least one particular separation trench may be formed to be filled with an insulation material (e.g., a dielectric material), so that the memory array is divided into several portions, each of which includes a certain number of digit lines which will be formed later, and word lines at one side of the separation trench are separated from word lines at the other side of the separation trench electrically.

Portions of the sacrificial layer and the insulative may be removed to form openings. The openings may expose portions of the substrate, the plurality of conductive contacts, and portions of the conductive materials and dielectric materials. A storage element material (e.g., the chalcogenide material) may be deposited in the openings. The storage element material may fill the recesses formed by the dielectric materials and the conductive materials. The storage element material may be partially removed from the openings such that only the storage element materials in the recesses remain.

Conductive pillars may be formed in the openings that include the storage element materials in the recesses. The conductive pillars may be examples of digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

Such configurations of a memory array and the methods of manufacturing may allow a higher-density of memory cells and a reduced power consumption relative to previous solutions. Each memory cell (e.g., storage element material) may be recessed inside opposite sides of the conductive pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each conductive pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example 3D memory arrays during manufacturing steps as described with reference to FIGS. 2A-8. These and other features of the disclosure are further illustrated by and described with reference to flowcharts that relate to vertical 3D memory array architecture as described with references to FIGS. 9 and 10. These and other features of the disclosure are further described in the context of an example 3D memory device with reference to FIG. 11.

FIG. 1 illustrates an example of a 3D memory array 100 in accordance with aspects of the present disclosure. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include a plurality of planes of a conductive material separated from one another by a second insulative material formed on the first insulative material on the substrate material. Each of the plurality of planes of the conductive material may include a plurality of recesses formed therein. The plurality of planes, for example, word line plates, may be obtained by a replacement process by using a sacrificial layer (e.g., a conformal layer) for etching during a stack deposition processing step, removing the conformal layer after cell definition and replacing the conformal layer with a more conductive material.

An insulative material may be formed in a serpentine shape through the second insulative material and the conductive material. A plurality of conductive pillars may be arranged in openings to extend substantially perpendicular to the plurality of planes of the conductive material and the substrate. Each respective one of the plurality of conductive pillars may be coupled to a different one of the conductive contacts.

In some examples, the memory decks 105 and 108 may include chalcogenide material configured to store logic states. For example, the memory cells of the memory decks 105 and 108 may be examples of self-selecting memory cells. A chalcogenide material may be formed in the plurality of recesses such that the chalcogenide material in each respective one of the plurality of recesses is at least partially in contact with one of the plurality of conductive pillars.

Figure 2A:
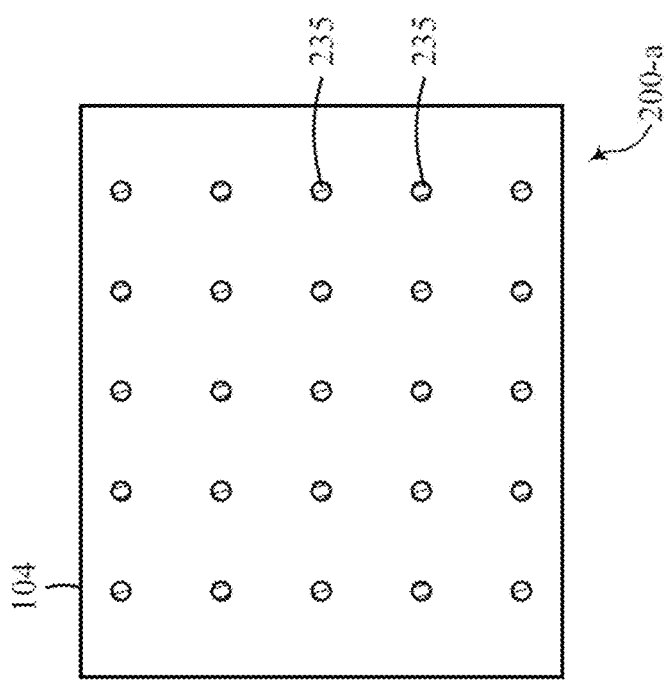
FIG. 2A illustrates a bottom view of an example 3D memory array in accordance with examples as disclosed herein.

FIG. 2A illustrates a bottom view of an example 3D memory array 200-*a* in accordance with examples as disclosed herein. The memory array 200-*a* may include a plurality of conductive contacts 235 formed in a substrate 104 and extending through the substrate 104 and coupled with an access line of the memory array 100. For example, the substrate 104 may be a dielectric material, such as a dielectric film.

A single conductive contact of the plurality of conductive contacts 235 may be configured to couple any single vertical pillar with a transistor (not shown). The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235 (see FIGS. 6A and 6B).

Figure 2B:
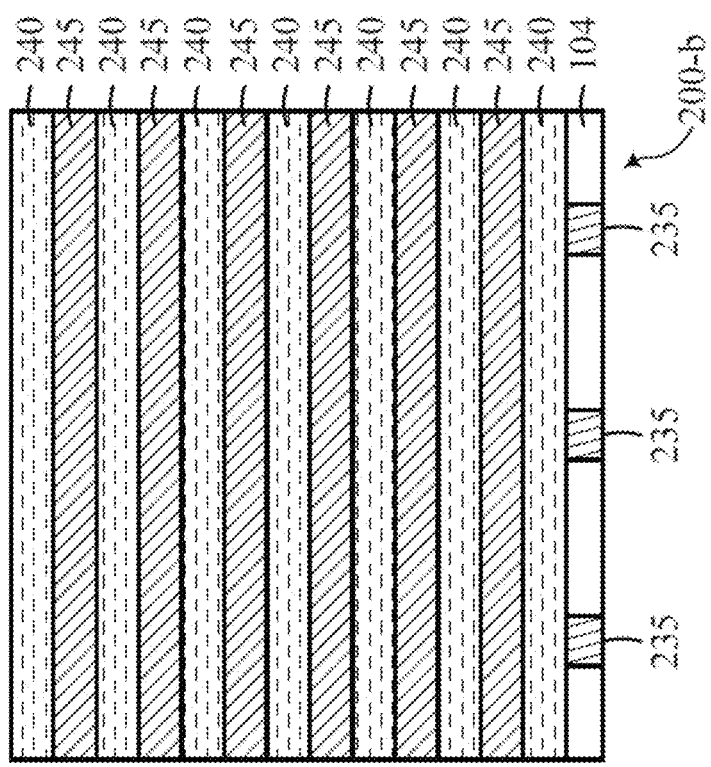
FIG. 2B illustrates a side view of an example 3D memory array in accordance with examples as disclosed herein.

FIG. 2B illustrates a side view of an example 3D memory array 200-*b* in accordance with examples as disclosed herein. The memory array 200-*b* may include plurality of conductive contacts 235 may be formed in the substrate 104. The memory array 200-*b* may also include a plurality of stacked planes of an insulative material 240 and a plurality of stacked planes of a conductive material 245 (e.g., word lines planes or word line plates). The stacked planes of conductive material 245 may be separated in a z-direction (e.g., separated vertically) from one another by the plurality of planes of the insulative material 240. For example, a first plane (e.g., a bottom plane) of the second insulative material 240 may be formed (e.g., deposited) on the plane of the substrate 104, and then a plane of the conductive material 245 may be formed on the first plane of the second insulative material 240. In some examples, a layer of the first insulative material 240 may be deposited on the substrate 104. In some examples, the conductive material 245 may be a layer of conductive carbon or other conductive layer compatible with active materials. In some examples, the conductive material 245 may include conductive layers separated by active material through a protective barrier. The conductive material 245 may be configured to function as at least one word line plate. In some examples, the conductive material 245 and the insulative material 240 form a plurality of layers, such as alternating layers.

Additional planes of the second insulative material 240 may be formed on the conductive material 245 in an alternating manner as illustrated in FIG. 2B. The second insulative material 240 may be a dielectric material, such as a dielectric film or layer. In some examples, the second insulative material 240 and the substrate 104 may be the same type of insulative material. Examples of the insulative materials disclosed herein include, but are not limited to dielectric materials, such as silicon oxide.

Each respective one of the plurality of planes of the conductive material 245 may be at (e.g., form) a different level of the 3D memory array 200-*b*. Individual planes of material that form memory cells may be referred to as a deck of the 3D memory array 200-*b*. The conductive material 245 may comprise (e.g., be formed of) a metallic (or semi-metallic) material or a semiconductor material such as a doped polysilicon material, among others. In some examples, the conductive material 245 may be a plane of conductive carbon.

Six planes of the conductive material 245 and seven planes of the second insulative material 240 are shown in FIG. 2B. The seventh plane of the second insulative material 240 may be a topmost layer of the 3D memory array 200-*b*. The quantity of planes of the conductive material 245 and the second insulative material 240 are not limited to the quantities illustrated in FIG. 2B. The conductive material 245 and the second insulative material 240 may be arranged into more than six decks or less than six decks.

FIGS. 3A-E illustrates various views of example 3D memory arrays 200-*c*, 200-*d*, 200-*e*, and 200-*f* during a series of steps or processes that may be performed to form a stacked memory device, in accordance with examples as disclosed herein. Specifically, in FIGS. 3A-E, a process of forming even and odd word line planes is shown.

Figure 3A:
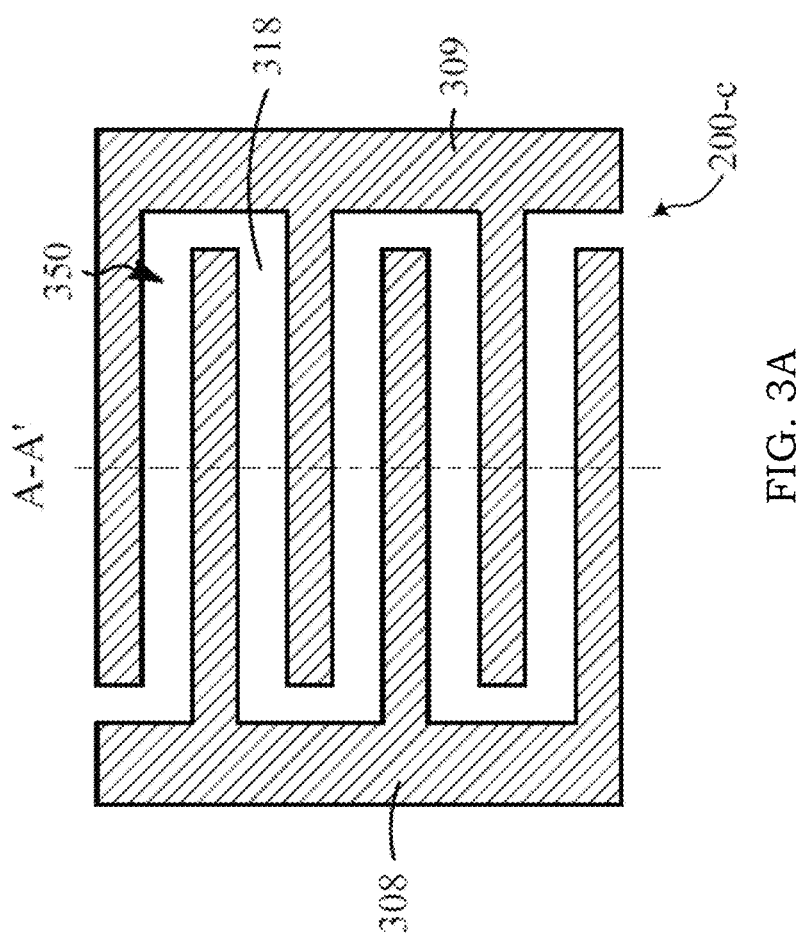
FIGS. 3A through 3E illustrate various views of example 3D memory array in accordance with examples as disclosed herein.
Figure 3B:
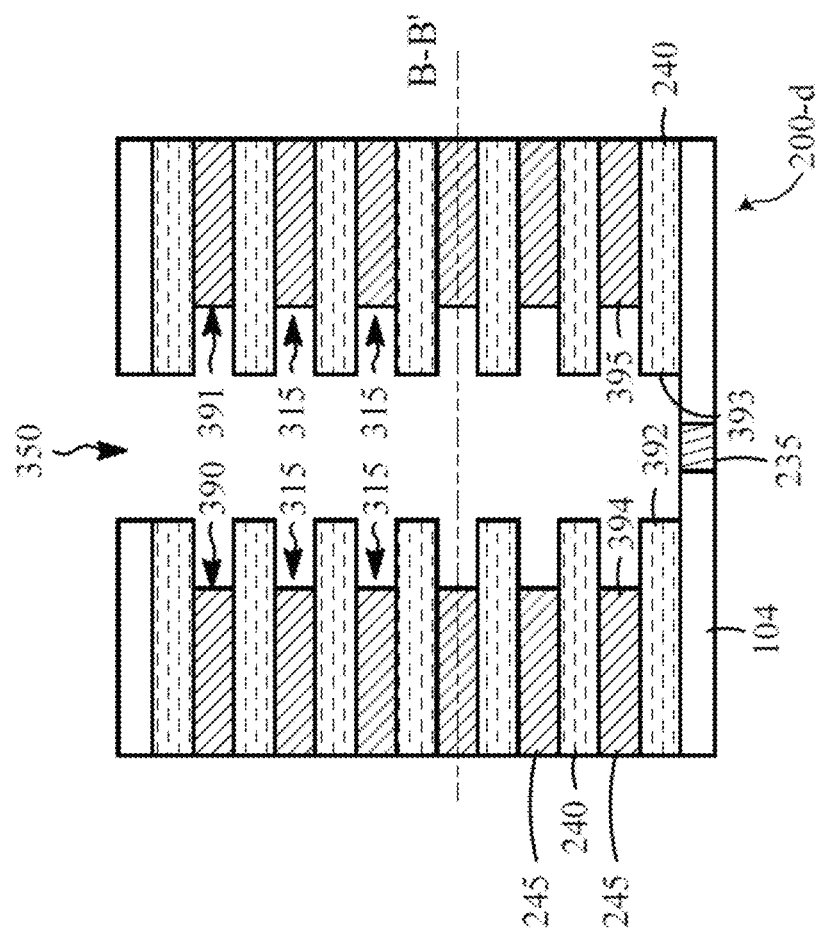
Figure 3C:
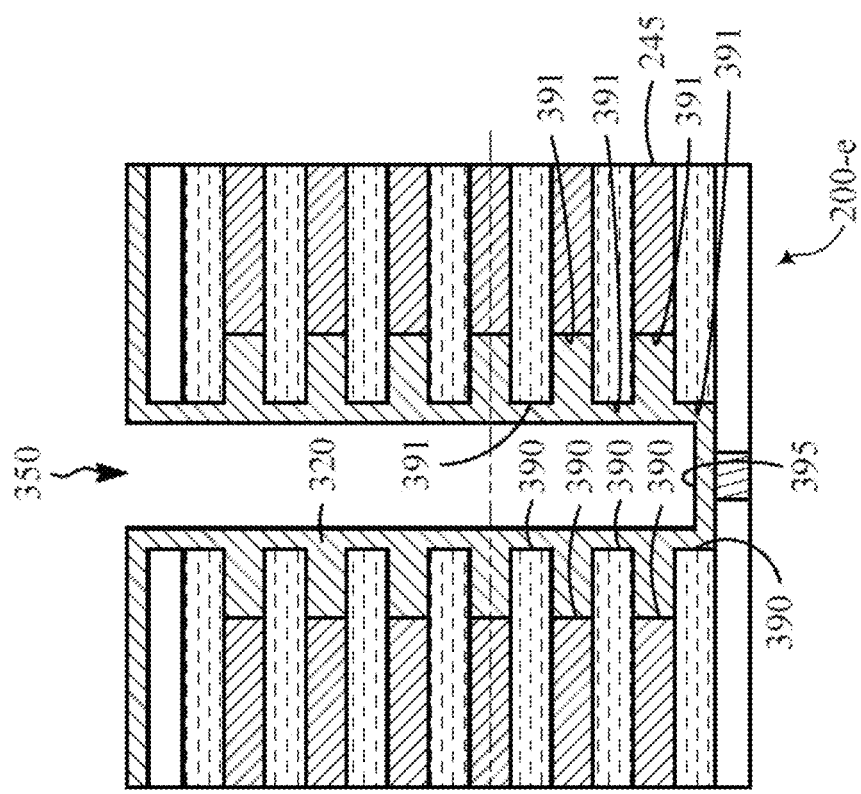
Figure 3D:
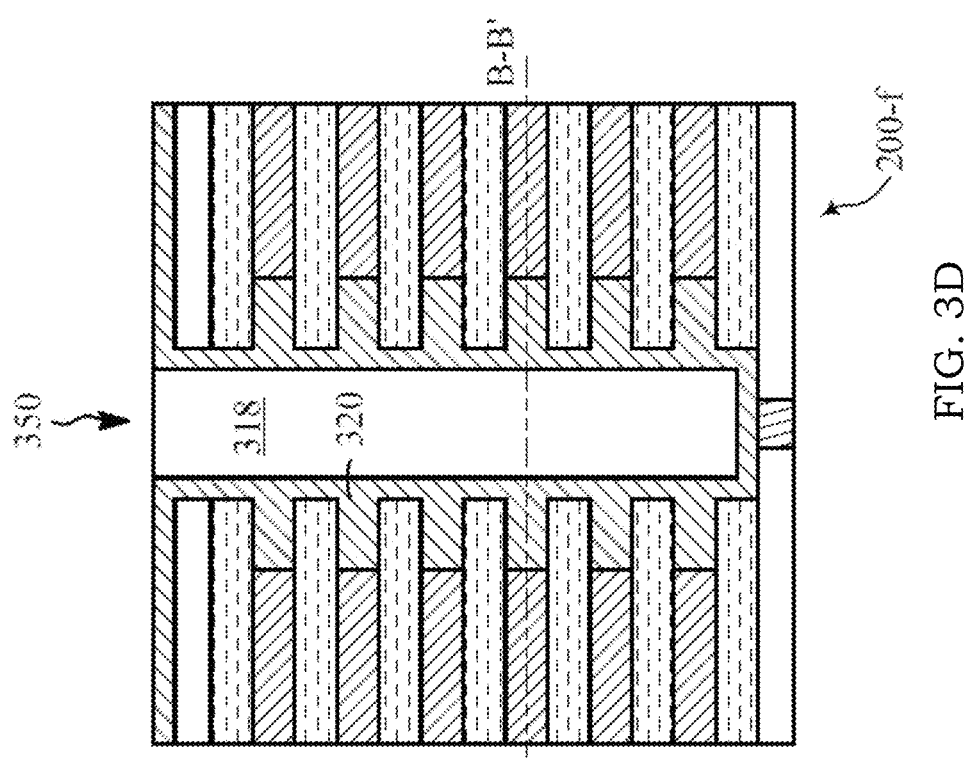
Figure 3E:
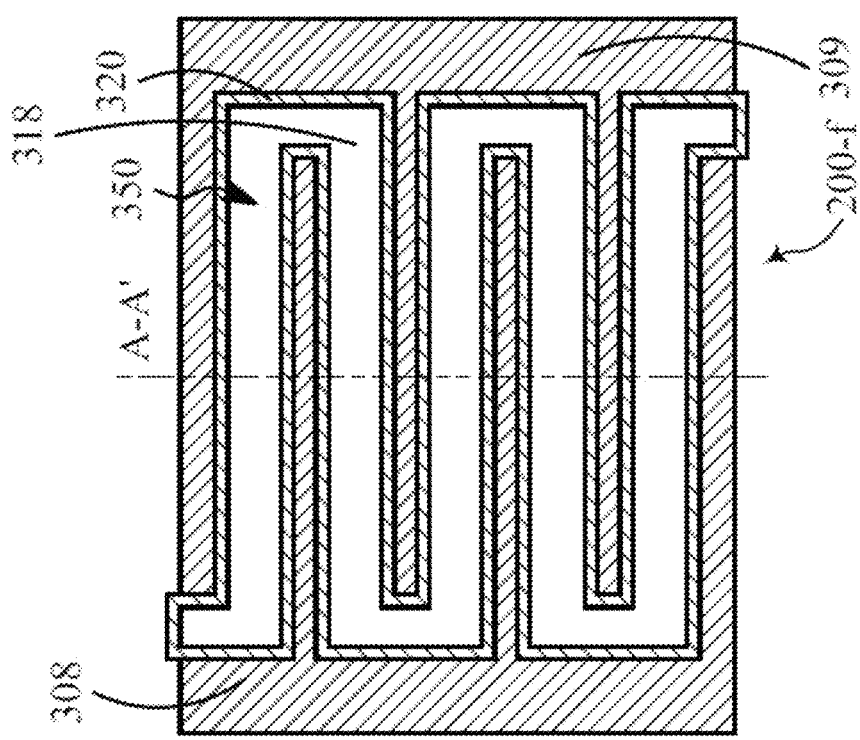

FIG. 3A illustrates a top view of an example 3D memory array 200-*c*, which may be an example of the memory array 200-*b* illustrated in FIG. 2B after a trench 350 is formed. FIG. 3B illustrates a cross-sectional view of an example 3D memory array 200-*d* along section line A-A' during a process step subsequent to what is illustrated in FIG. 3A. FIG. 3C illustrates a cross-sectional view of an example 3D memory array 200-*e* along section line A-A' during a process step subsequent to what is illustrated in FIG. 3B. FIG. 3D illustrates a cross-sectional view of an example 3D memory array 200-*f* along section line A-A' during a process step subsequent to what is illustrated in FIG. 3C. FIG. 3E illustrates a top view of an example 3D memory array 200-*f* of section line B-B' during a process step subsequent to what is illustrated in FIG. 3C. FIGS. 3A-E illustrate a series of steps or processes that may be performed to form a stacked memory device.

FIG. 3A illustrates forming the trench 350 through the alternating planes of conductive material 245 (shown in FIG. 3B) and the second insulative material 240 (shown in FIG. 3B) of memory array 200-*c*. The trench 350 may expose the substrate 104 (previously shown in FIGS. 2A and 2B) and the conductive contacts 235 (previously shown in FIGS. 2A and 2B) at the bottom of the trench 350.

The trench 350 may be etched from top to bottom and etched in a serpentine-shape. For instance, the trench 350 may pass over a row of the conductive contacts 235 in a first direction (e.g., from left to right) and then pass over an adjacent row of the conductive contacts 235 in a second direction that is opposite to the first direction (e.g., from right to left). With reference to the example of FIG. 3A, the trench 350 passes over a first row of the conductive contacts 235 from left to right, then "turns" and passes over the next (second) row of conductive contacts 235 (adjacent to the first row) from right to left. The trench 350 "turns" again and passes over the next (third) row of conductive contacts 235 (adjacent to the second row) from left to right. The trench 350 "turns" again and passes over the next (fourth) row of conductive contacts 235 (adjacent to the third row) from right to left and then "turns" again and passes over the next (fifth) row of conductive contacts 235 at the bottom of FIG. 3A (adjacent to the fourth row) from left to right.

The trench 350 may bifurcate each plane of the conductive material 245 into at least two portions: a first portion 308 and a second portion 309. Each portion of a plane of the conductive material 245 may be a different access line (e.g., even word line or odd word line) of a deck. For example, the first portion 308 may be a first access line of a deck of the 3D memory array 200-c and the second portion 309 may be a second access line of the same deck of the 3D memory array 200-c. The extension of the fingers forming the even or odd planes may be defined based on the resistivity of an electrode used and by the level of current delivery requested. Specifically, the depth of the recesses is defined depending on the thickness desired for the memory cell.

FIG. 3B illustrates forming a plurality of recesses 315 in the conductive material 245 in each of the planes of memory array 200-d. For example, a selective etching operation may be performed to form the plurality of recesses 315 in sidewalls 390 and 391 of the trench 350 in an isotropic way. In some examples, the trench 350 includes a first sidewall 390 spaced apart from a second sidewall 391, where a first portion 392 of the first sidewall 390 formed by the first insulative material 240 is spaced apart from a first portion 393 of the second sidewall 391 formed by the first insulative material 240 by a first distance. A second portion 394 of the first sidewall 390 formed by the first conductive material 245 may be spaced apart from a second portion 395 of the second sidewall 391 formed by the first conductive material 245 by a second distance greater than the first distance. In some examples, portions of sidewalls 390 and 391 of the trench 350 formed by the first conductive material 245 are recessed relative to portions of the sidewalls 390 and 391 of the trench 350 formed by the first insulative material 240.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 350 and a horizontal etching process may be used to form at least one recess 315 in at least one conductive material 245. The etching parameters may be selected such that the conductive material 245, for example, is etched faster than the second insulative material 240.

FIG. 3C illustrates forming a conformal material 320 (e.g., a sacrificial material or sacrificial layer). The conformal material 320 may be deposited into the trench 350 of memory array 200-e. The conformal material 320 may be formed in the recesses 315 (shown in FIG. 3B) by conformally depositing the conformal material 320. The conformal material 320 contacts a first sidewall 390, a second sidewall 391, and a bottom wall 395 of each trench 350. Although FIG. 3C shows the conformal material 320 may be formed on the sidewalls of the trench 350 (e.g., on the surfaces of the second insulative material 240 and the conductive materials 245 in different layers facing into the trench 350) during formation of the conformal material 320 in the plurality of recesses 315, examples are not so limited. For example, the conformal material 320 may be confined to only the plurality of recesses 315 in the conductive materials 245 in different layers in some cases. In some cases, the conformal material 320 may be referred to as a conformal layer or a sacrificial layer.

In some cases, an etching operation may be performed subsequent to forming the conformal material 320. In the etching operation, the conformal material 320 may be etched to form an opening or trench 350. The etch operation may result in the surfaces of the conformal material 320 (e.g., the surfaces facing the trench 350) being spaced apart from the surfaces of the second insulative material 240 (e.g., the surfaces facing into the trench 350). In some cases, the etch operation may result in the surfaces of the conformal material 320 (e.g., the surfaces facing the trench 350) being approximately coplanar with surfaces of the second insulative material 240 (e.g., the surfaces facing into the trench 350), and thereby forming a continuous sidewall of trench. The etching operations described herein may be vertical etching processes (e.g., an anisotropic etching process or a dry etching process, or a combination thereof) or horizontal etching processes (e.g., an isotropic etching process). For example, a vertical etching process may be performed to vertically etch the trench 350 and a horizontal etching process may be used to form at least one recess in the first conductive material 245.

FIG. 3D illustrates depositing a dielectric material 318 in the trench 350 on top of the conformal material 320 of the memory array 200-f. The dielectric material 318 may contact the conformal material 320. The dielectric material 318 and the conformal material 320 may cooperate to fill the trench 350. In some cases, the dielectric material 318 may be an example of an insulative material. In some examples, the conformal material 320 may be etched back selectively to form a co-planar surface with the dielectric material 318. The depth of the recession may be defined depending on a desired thickness.

FIG. 3E illustrates a top view of an example 3D memory array 200-f after the dielectric material 318 is deposited (as shown in FIG. 3D), in accordance with an example of the present disclosure. In FIG. 3E, the conformal material 320 formed in the trench 350 and the dielectric material 318 bifurcates each plane of the conductive material 245 into a first portion 308 and a second portion 309.

FIGS. 4A-E illustrates various views of example 3D memory arrays 200-g, 200-h, 200-i, and 200-j, during a series of steps or processes that may be performed to form a stacked memory device, in accordance with examples as disclosed herein. Specifically, FIGS. 4A-E illustrate processes for forming memory cells in the memory array 200-f illustrated in FIGS. 3D and 3E.

Figure 4A:
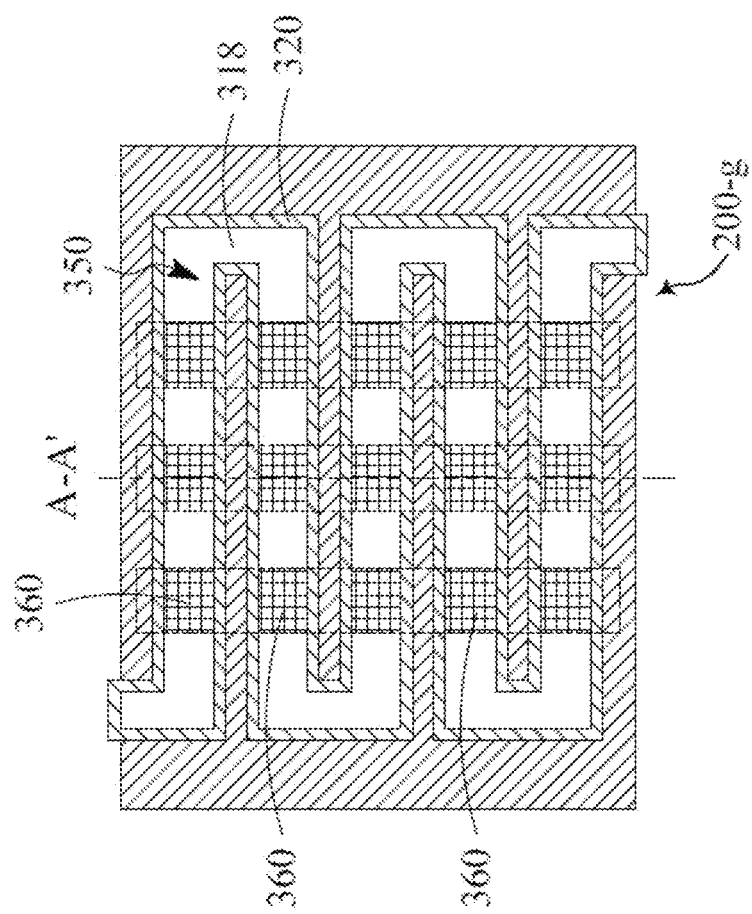
FIGS. 4A through 4E illustrate various views of example 3D memory array in accordance with examples as disclosed herein.
Figure 4B:
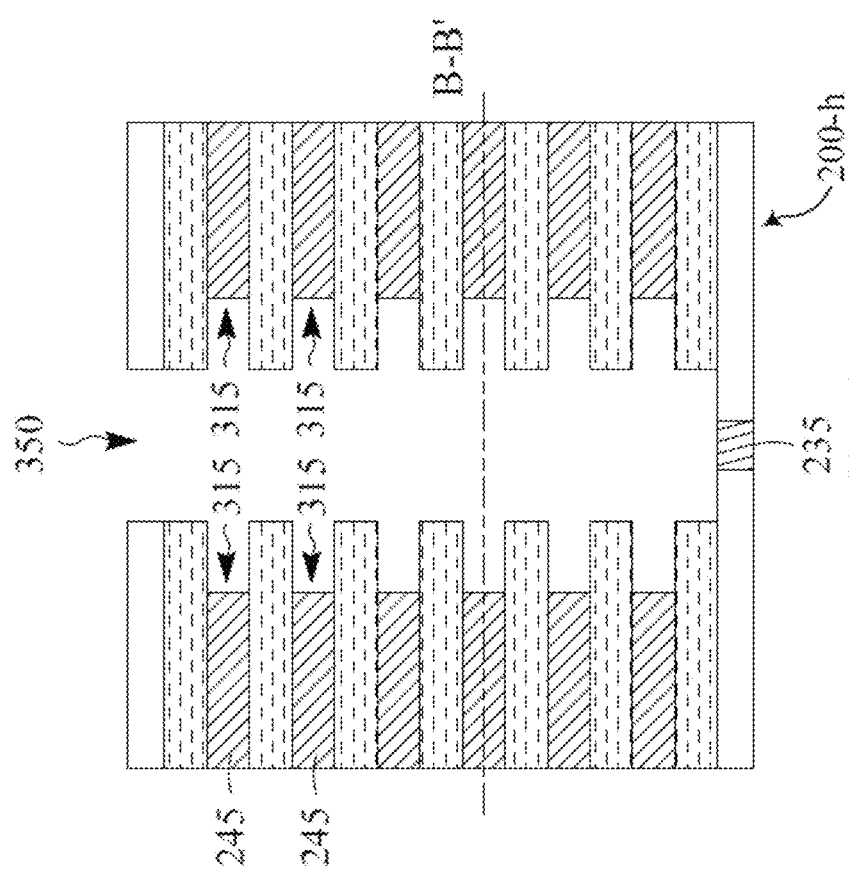
Figure 4C:
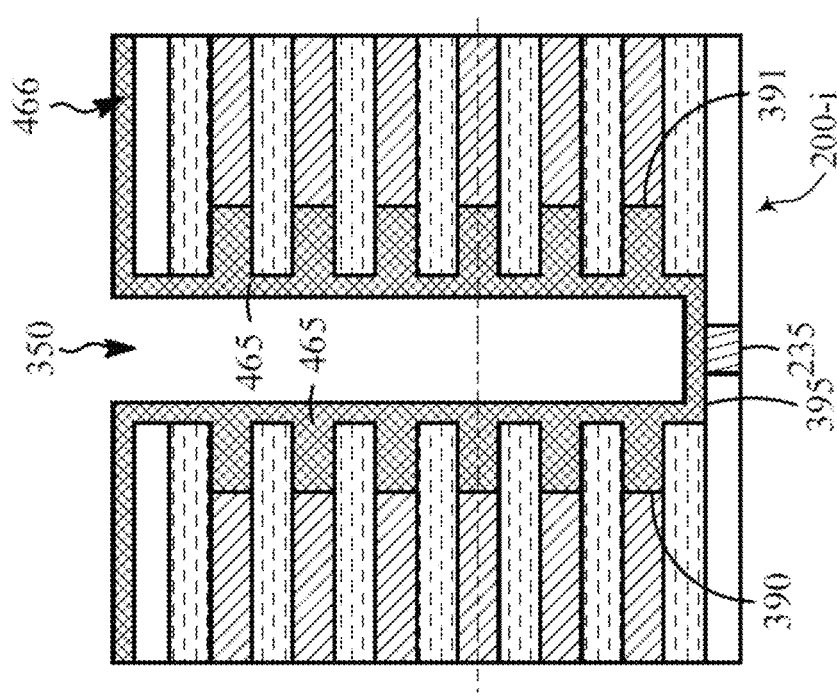
Figure 4D:
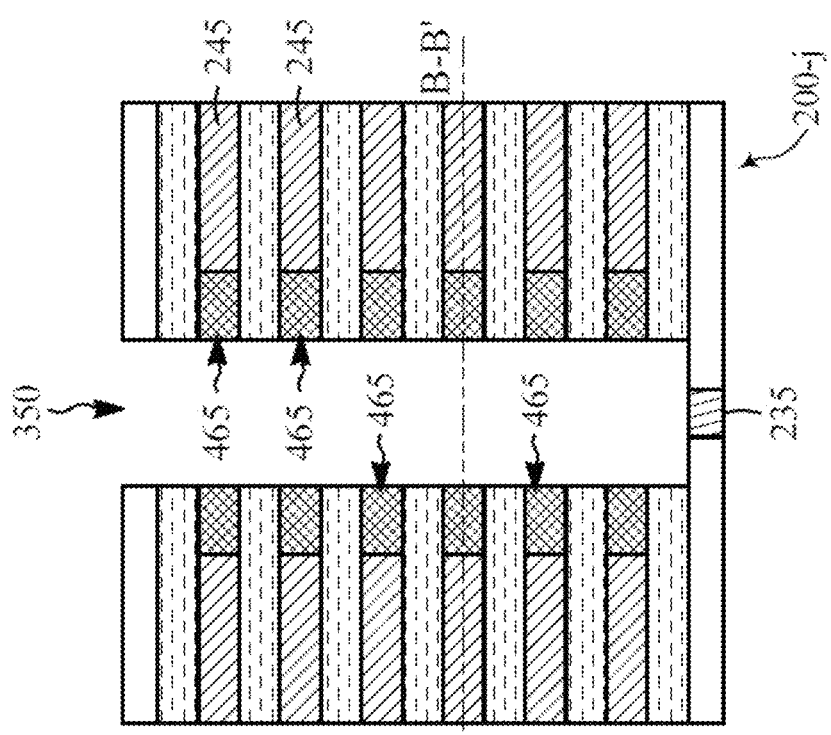
Figure 4E:
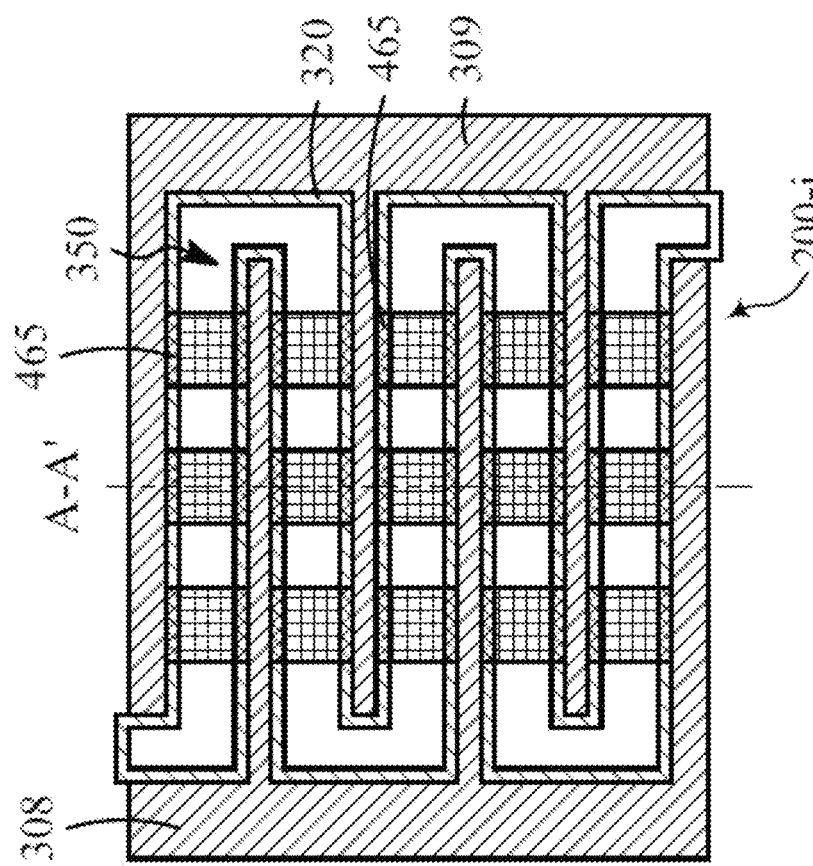

FIG. 4A illustrates a top view of a memory array 200-g, which may be an example of the memory array 200-f illustrated in FIG. 3E after formation of openings 360. FIG. 4B illustrates a cross-sectional view of an example 3D memory array 200-h along section line A-A' during a process step subsequent to what is illustrated in FIG. 4A. FIG. 4C illustrates a cross-sectional view of an example 3D memory array 200-i along section line A-A' during a process step subsequent to what is illustrated in FIG. 4B. FIG. 4D illustrates a cross-sectional view of an example 3D memory array 200-j along section line A-A' during a process step subsequent to what is illustrated in FIG. 4C. FIG. 4E illustrates a top view of the example 3D memory array 200-j of section line B-B' during a process step subsequent to what is illustrated in FIG. 4C.

FIG. 4A illustrates a top view through any one of the planes of the conductive material 245 of the memory array 200-g. A plurality of openings 360 in a trench 350 may be formed by etching away a portion of the dielectric material 318 and/or the conformal material 320. The openings 360 are intended to be positioned in alignment with the plurality of conductive contacts 235 so that forming the openings 360 exposes at least a portion of a plurality of conductive contacts 235 (shown in FIG. 4B) extending through the substrate 104 (shown in FIG. 4B). The etching process may be a vertical etching process. In some examples, the etching operation may not etch away all portions of the conformal material 320, for example, where the plurality of openings 360 are not formed.

FIG. 4B illustrates a cross-sectional view of an example 3D memory array 200-h in accordance with an example of the present disclosure. As shown in FIG. 4B, a plurality of recesses 315 may be formed in the conductive material 245 in each of the planes. For example, a selective etching operation may be performed to form the plurality of recesses 315 in a full or partially isotropic way. The etching chemistry may be selected to selectively reach a conductive material 245. The conductive contacts 235 may be exposed by forming the openings 360 in the trench 350.

FIG. 4C illustrates a cross-sectional view of an example 3D memory array 200-i in accordance with an example of the present disclosure. As shown in FIG. 4C, a storage element material 465 may be formed in the plurality of recesses 315 by conformally depositing the storage element material 465 into the trench 350. The storage element material 465 may be deposited to contact sidewalls 390 and 391 and a bottom wall 395 of the trench 350 exposed by the etching of the conformal material 320. When the storage element material 465 contacts the bottom wall 395 of the trench 350, the storage element material 465 covers the exposed conductive contacts 235.

The storage element material 465 may be an example of a chalcogenide material, such as a chalcogenide alloy and/or glass, that may serve as a self-selecting storage element material (e.g., a material that may serve as both a select device and a storage element). For example, the storage element material 465 may be responsive to an applied voltage, such as a program pulse. For an applied voltage that is less than a threshold voltage, the storage element material 465 may remain in an electrically nonconductive state (e.g., an "off" state). Alternatively, responsive to an applied voltage that is greater than the threshold voltage, the storage element material 465 may enter an electrically conductive state (e.g., an "on" state).

The storage element material 465 may be programmed to a target state by applying a pulse (e.g., a programming pulse) that satisfies a programming threshold. The amplitude, shape, or other characteristics of the programming pulse may be configured to cause the storage element material 465 to exhibit the target state. For example, after applying the programming pulse, the ions of the storage element material 465 may be redistributed throughout the storage element, thereby altering a resistance of the memory cell detected when a read pulse is applied. In some cases, the threshold voltage of the storage element material 465 may vary based on applying the programming pulse.

The state stored by the storage element material 465 may be sensed, detected, or read by applying read pulse to the storage element material 465. The amplitude, shape, or other characteristics of the read pulse may be configured to allow a sense component to determine what state is stored on the storage element material 465. For example, in some cases, the amplitude of the read pulse is configured to be at a level that the storage element material 465 will be in an "on" state (e.g., current is conducted through the material) for a first state but will be in an "off" state (e.g., little to no current is conducted through the material) for a second state.

In some cases, the polarity of the pulse (whether programming or read) applied to the storage element material 465 may affect the outcomes of the operation being performed. For example, if the storage element material 465 stores a first state, a read pulse of a first polarity may result in the storage element material 465 exhibiting an "on" state while a read pulse of a second polarity may result in the storage element material 465 exhibiting an "off" state. This may occur because of the asymmetrical distributions of ions or other material in the storage element material 465 when it is storing a state. Similar principles apply to programming pulses and other pulses or voltages.

Examples of chalcogenide materials that may serve as the storage element material 465 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

FIG. 4D illustrates a cross-sectional view of an example 3D memory array 200-j in accordance with an example of the present disclosure. An etching operation may be performed subsequent to forming the storage element material 465 so that surfaces of the storage element material 465 (e.g., the surfaces facing into the trench 350) is approximately coplanar with surfaces of the second insulative material 240 (e.g., the surfaces facing into the trench 350) as illustrated in FIG. 4D. The etching of the storage element material 465 may form a continuous sidewall and remove the top layer 466 (shown in FIG. 4C) of the storage element material 465, whereby cells of the storage element material 465 are formed in the recesses only. In each recess, each cell of the storage element material 465 may contact a single conductive material 245 (e.g., a single conductive material 245 located adjacent to the cell of the storage element material 465) and at least two dielectric layers (e.g. a top dielectric layer and a bottom dielectric layer located on top of the cell of the storage element material 465 and on bottom of the cell of the storage element material 465), as shown in FIG. 4D. The etching of the storage element material 465 may provide a configuration in which the storage element material 465 are separated from one another. The etching of the storage element material 465 may also expose the conductive contacts 235 in the substrate 104. In some examples, portion of sacrificial material may be located on either side of the cell of the storage element material 465 (as shown in FIG. 4E).

FIG. 4E illustrates a top view of an example 3D memory array 200-*j* in accordance with an example of the present disclosure. As illustrated in FIG. 4E, the conformal material 320 and the storage element material 465 formed in the trench 350 may bifurcate each plane of the conductive material 245 into a first portion 308 and a second portion 309. Each portion of a plane may be an example of a word line plate.

Figure 5A:
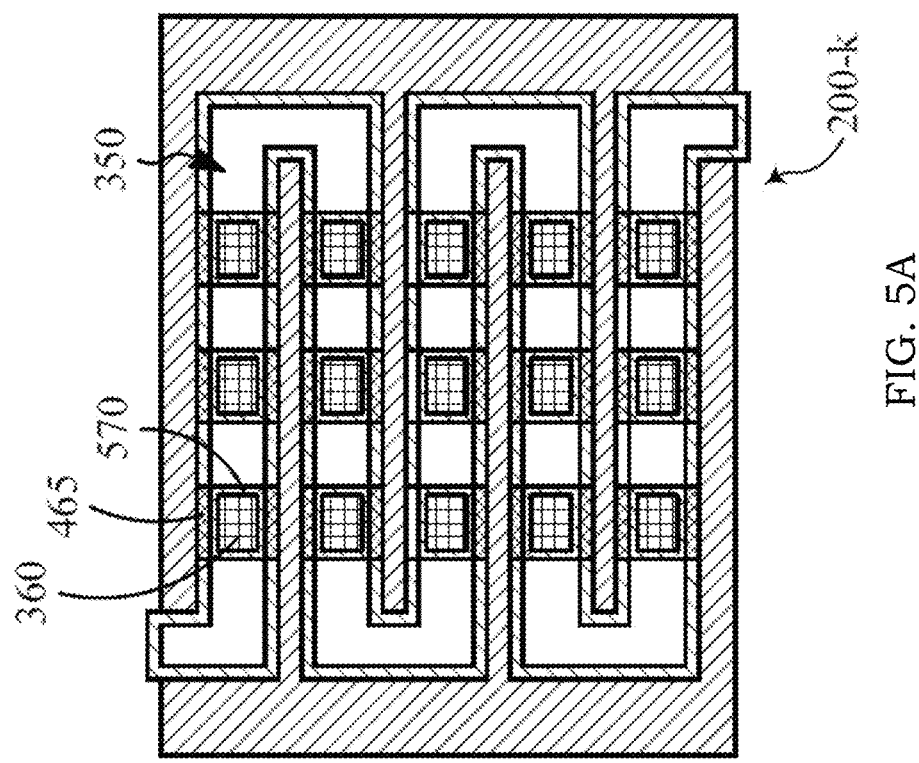
FIGS. 5A through 5C illustrate various views of example 3D memory arrays in accordance with examples as disclosed herein.
Figure 5B:
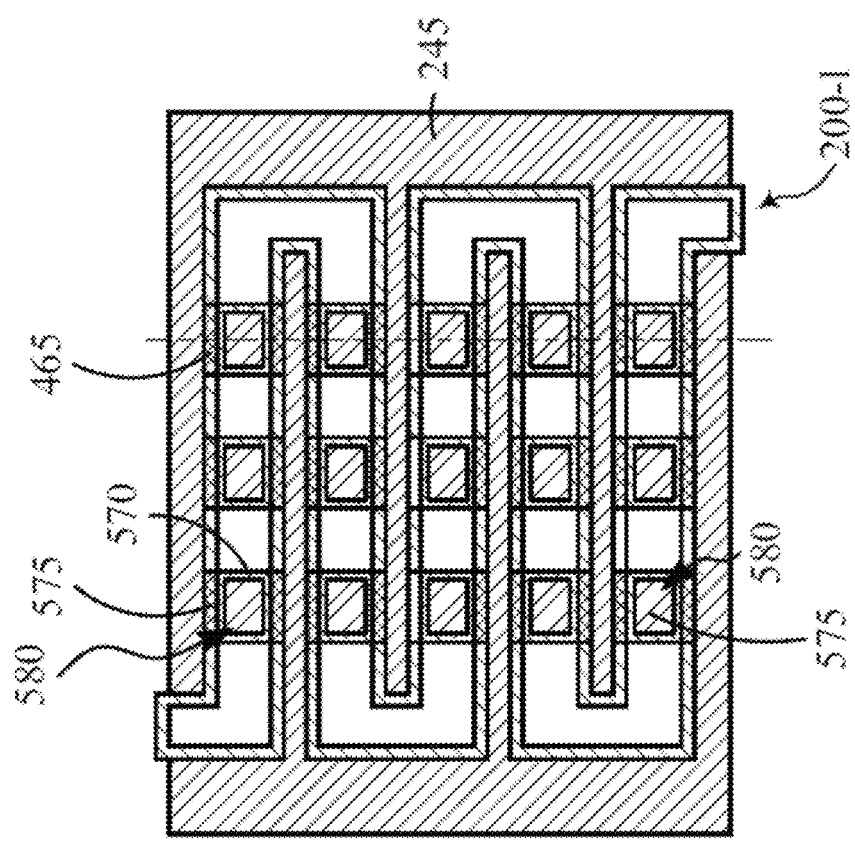
Figure 5C:
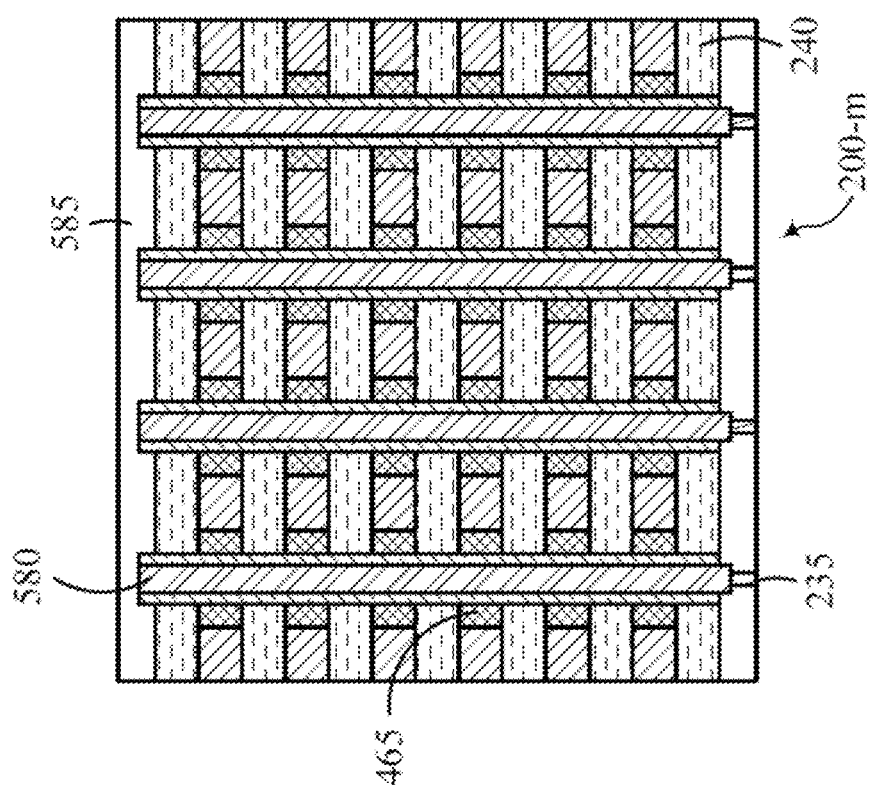

FIGS. 5A-C illustrates various views of example 3D memory arrays 200-*k*, 200-*l*, and 200-*m*, during a series of steps or processes that may be performed to form a stacked memory device, in accordance with examples as disclosed herein. Specifically, FIGS. 5A-C illustrate processes of filling the openings 360 after the recessed self-selecting memory cells are formed.

FIG. 5A illustrates a top view of a memory array 200-*k*, which may be an example of the memory array 200-*j* illustrated in FIG. 4E after formation of recessed self-selecting memory cells. FIG. 5B is a top view of a memory array 200-*l* through any one of the planes of the conductive material 245 illustrated in FIG. 4E during a processing step that is subsequent to what is illustrated in FIG. 5A. FIG. 5C illustrates a cross-sectional view of an example 3D memory array 200-*m* along section line A-A' during a processing step that is subsequent to what is illustrated in FIG. 5B.

FIG. 5A illustrates a top view of a memory array 200-*k* where a barrier material 570 is deposited into the openings 360 of the trench 350. In some implementations, the barrier material 570 contacts at least one portion of the first insulative material 240 (not shown), the second insulative material 240 (not shown), and the storage element material 465. In some examples, the barrier material 570 is compatible with an active material. In some examples, the barrier material 570 may be a conductive material, or a barrier layer with a conductive material. The barrier layer may comprise aluminum oxide, for example. In some examples, an etching operation may be performed to make room for conductive material to be deposited into the trench 350. In some cases, the barrier material 570 may be referred to as a barrier layer.

FIG. 5B illustrates a top view of a memory array 200-*l* where a conductive material 575 is deposited into the openings 360 of the trench 350. A conductive material 575 may deposited in the opening 360 to form a conductive pillar 580. The conductive pillar 580 may include the barrier material 570 and the conductive material 575. In some examples, the conductive pillar 580 may be formed in contact with the storage element material 465 on the sidewalls 390 and 391 (shown in FIG. 4C) of the trench 350. In some examples, the conductive pillar 580 may comprise the same material as the conductive material 575. In some examples, the conductive pillar 580 may be a digit line. The conductive pillar 580 may be a cylinder. Although FIG. 5D illustrates the conductive pillar 580 as a solid pillar, in some examples the conductive pillar 580 may be a hollow cylinder or toroidal (e.g., a tube). The conductive pillar 580 may comprise a metallic (or semi-metallic) material or a semiconductor material such as a doped polysilicon material, among others. However, other metallic, semi-metallic, or semiconductor materials may be used.

The conductive pillar 580 formed in each respective one of the plurality of openings 360 are arranged to extend substantially orthogonal to the alternating planes of the conductive material 245 and the second insulative material 240 (not shown). The storage element material 465 and the conductive pillar 580 formed in each respective one of the plurality of openings 360 are formed in a substantially square shape. However, examples of the present disclosure are not limited to exact or quasi-exact square shapes. For instance, the storage element material 465 and the conductive pillar 580 may formed in any shape, including circles or oval shapes, for instance.

FIG. 5C illustrates a side view of an example 3D memory array 200-*m* in accordance with an example of the present disclosure. As illustrated in FIG. 5C, a capping layer 585 (e.g., an insulative material, such as a dielectric layer) may be deposited to cap the conductive pillars 580 of memory array 200-*l*.

The memory array 200-*m* may include a plurality of vertical stacks. Each respective stack may include the conductive pillar 580, a conductive contact 235 coupled to the conductive pillar 580, the storage element material 465 formed in contact with the first portion 308 and the conductive pillar 580, and the storage element material 465 formed in contact with the second portion 309 and the conductive pillar 580.

The conductive pillar 580 may be in contact with the conductive contact 235 and the first insulative material 240, and in contact with the storage element material 465 formed in the recesses 315. In some cases, the storage element material 465 formed in each respective recess 315 is formed partially (e.g., not completely) around the conductive pillar 580.

Although not shown in FIG. 5C for clarity and so as not to obscure examples of the present disclosure, other materials may be formed before, after, and/or between the storage element material 465, and/or the conductive pillar 580, for example, to form adhesion layers or barriers against interdiffusion of materials and/or to mitigate composition mixing.

Figure 6A:
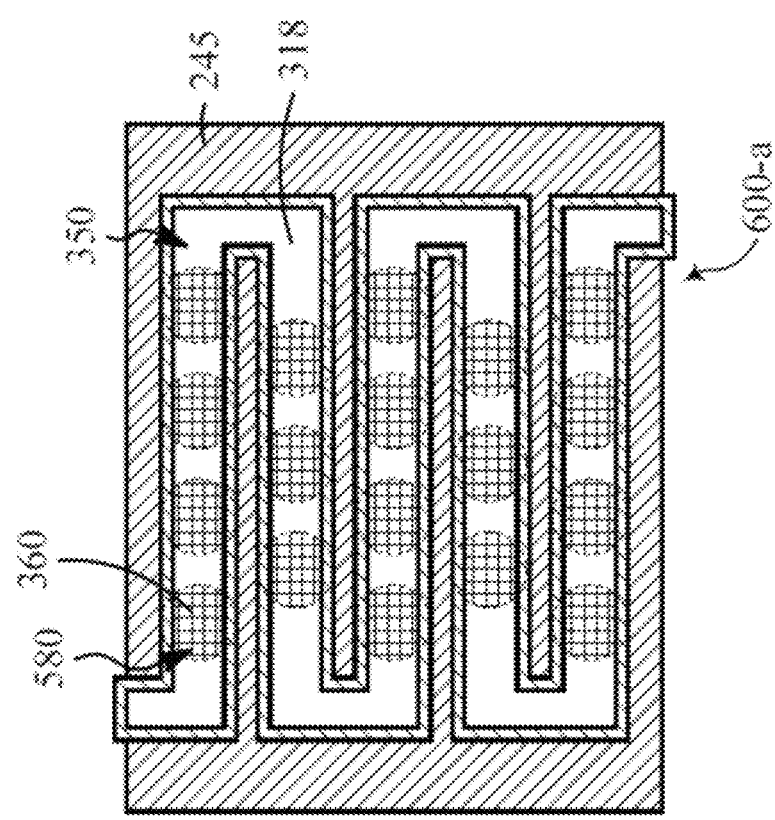
FIGS. 6A through 6B illustrate various views of example 3D memory array in accordance with examples as disclosed herein.
Figure 6B:
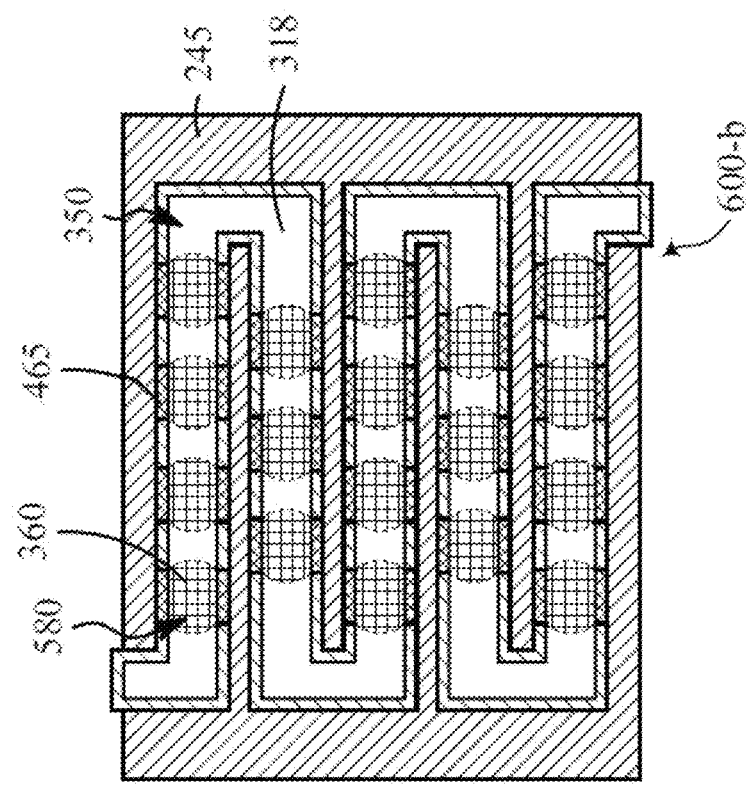

FIGS. 6A-B illustrates various views of example 3D memory arrays 600-*a* and 600-*b*, which may be examples of the 3D memory arrays 200-*a* through 200-*m* processed in FIGS. 2A-5C, in accordance with examples as disclosed herein. The memory arrays 600-*a* and 600-*b* may include similar features as memory array 200 described with reference to FIGS. 2A-5C. A plurality of openings 360 may be formed through the alternating planes of the conductive material 245 and the second insulative material 240 (not shown), and the dielectric material 318 in the trench 350. As shown, the diameter of the plurality of openings 360 is approximately the same width of the trench 350. In some examples, the diameter of the plurality of openings 360 may be greater than the width of the trench 350.

Each of the plurality of openings 360 may be approximately concentric with a different respective one of the conductive contacts 235. As shown in FIGS. 6A and 6B, the pillars 580 are circular and formed over and coupled to the plurality of contacts in geometric pattern in respective openings 360. In some examples, such as illustrated in FIGS. 2A-3E, the openings 360 may be square.

The plurality of openings 360 may have the staggered (e.g., hexagonal) arrangement of the conductive contacts 235 (not shown). For example, a respective one of the plurality of conductive contacts 235 may be surrounded by six other conductive contacts 235.

A staggered pattern may refer to any pattern where positions of objects (e.g., contacts, openings, or pillars) in a first row are offset from positions of objects (e.g., contacts, openings, or pillars) in a second row adjacent to the first row in a given direction. For example, a staggered pattern may have objects (e.g., contacts, openings, or pillars) adjacent to one another in the x-direction (e.g., rows), but not in the y-direction (e.g., columns). For instance, as illustrated in FIGS. 6A and 6B, the plurality of conductive contacts 235 are adjacent to each other and in line with each other in an x-direction. However, the plurality of conductive contacts 235 are not adjacent to each other in the y-direction. The plurality of conductive contacts 235 are in line with each other in the x-direction and the plurality of conductive contacts 235 alternate (e.g., skip) rows in the y-direction. Although, FIGS. 6A and 6B show spacing that is approximately the same between the conductive contacts 235 throughout the substrate 104, examples in accordance with the present disclosure are not so limited. For example, the spacing between the conductive contacts 235 may vary throughout the substrate 104.

FIG. 6B shows that the 3D memory array may include a plurality of storage element materials 465, each comprising a chalcogenide material positioned between at least one of the word line plates, at least one circular pillar 580, and at least one dielectric material 318. In some examples, depending on the decoding optimization, the pillars 580 may be coupled to a plurality of selectors positioned at a top, a bottom, or both a top and a bottom (e.g., below or above the plurality of word line plates) of the 3D memory array 600.

Figure 7A:
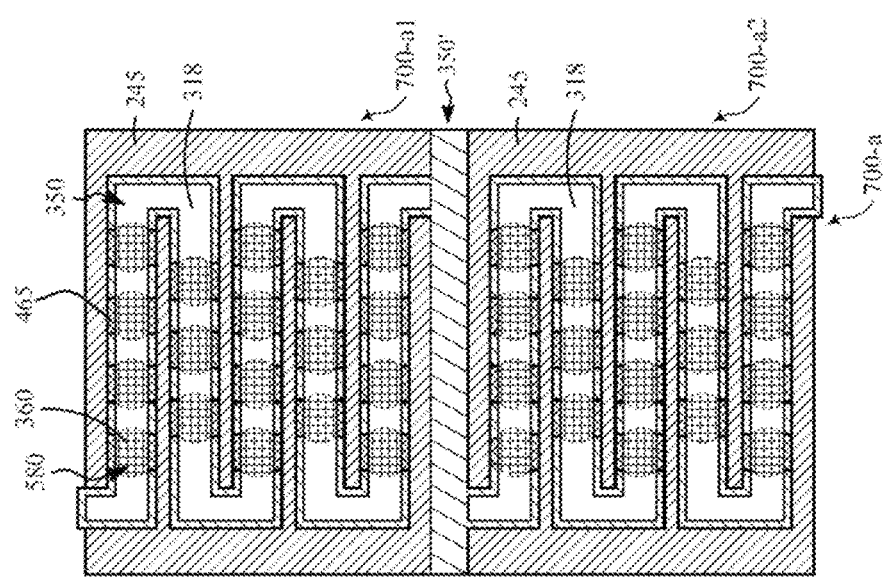
FIGS. 7A through 7C illustrate various views of example 3D memory array in accordance with examples as disclosed herein.
Figure 7B:
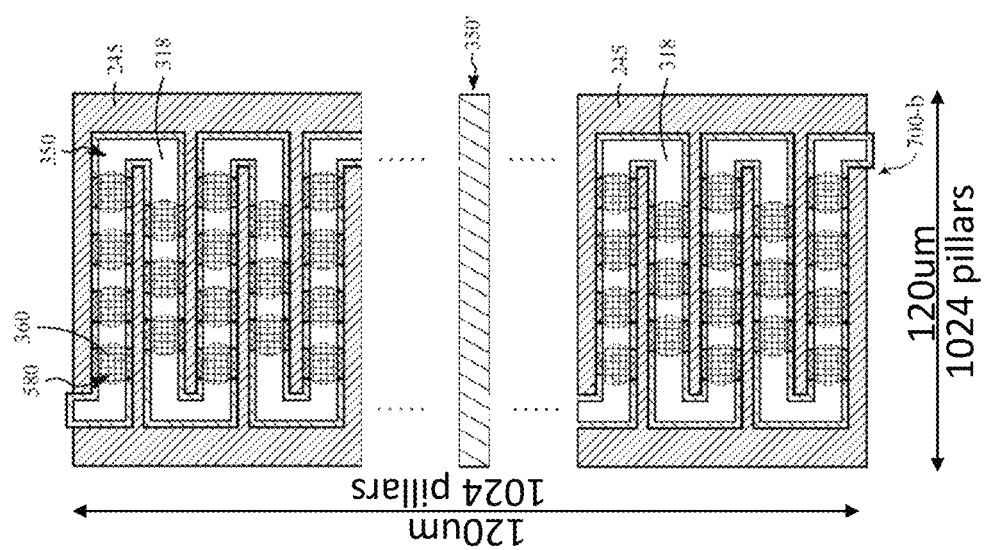
Figure 7C:
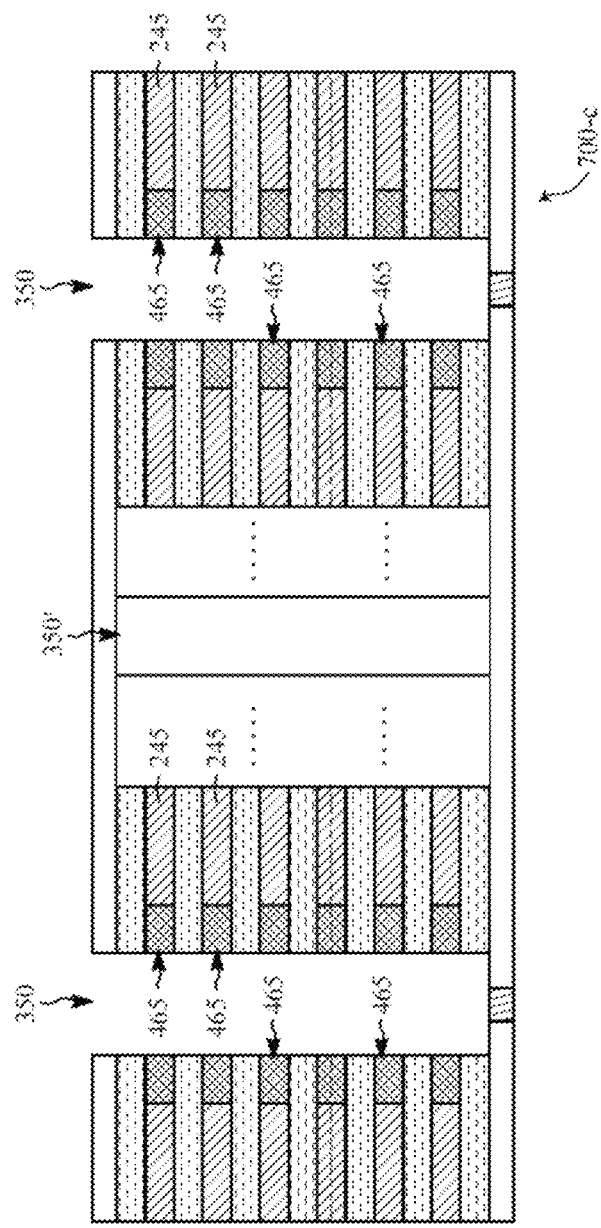

FIGS. 7A-C illustrates various views of example 3D memory arrays 700-a, 700-b, and 700-c, which may be examples of the 3D memory arrays 200-a through 200-m processed in FIGS. 2A-5C and the 3D memory arrays 600-a through 600-b processed in FIGS. 6A-6B, in accordance with examples as disclosed herein. The memory arrays 700-a, 700-b, and 700-c may include similar features as memory array 200 described with reference to FIGS. 2A-5C and memory array 600 described with reference to FIGS. 6A-6B. A particular separation trench 350', which is filled with an insulation material or a dielectric material, may be formed between two sub-arrays (e.g., a first sub-array 700-a1 and a second sub-array 700-a2), such that the first sub-array 700-a1 and the second sub-array 700-a2 can be separated with each other electrically. In some examples, the memory array 700-a may include a plurality of word line plates separated from one another with respective dielectric layers (refer to the side view of the memory array shown in FIG. 7C). The plurality of word line plates may include a several sets of word lines. In the first sub-array 700-a1, a first set of word lines is separated from a second set of word lines with a dielectric material extending in a serpentine shape. In the second sub-array 700-a2, a third set of word lines is separated from a fourth set of word lines with a dielectric material extending in a serpentine shape. The first set of word lines and the second set of word lines are separated from the third set of word lines and the fourth set of word lines by the particular separation trench 350'. Only one particular separation trench 350' is shown in FIGS. 7A-7C, which is for a purpose of illustration. The quantities of the particular separation trench 350' and the sub-arrays 700-a1 and 700-a2 are not limited to the quantities illustrated in FIGS. 7A-7C. Several separation trenches 350' may be formed in a 3D memory array as needed.

With the separation trench 350' filled with an insulation material or a dielectric material, which may also be called as a separation layer, a power consumption of a 3D memory array may be further reduced while meeting a storage class memory (SCM) specification. Compared to a 3D memory array in which a plurality of sub-arrays are coupled with each other, a 3D memory array with serval separation layers interposed, a corresponding capacitance value may drop down and the power consumption may also be further reduced without increasing decoding burden.

As shown in FIG. 7A, in some examples, after forming the trench 350 in a serpentine shape in the 3D memory array 700-a, a particular portion of the trench 350 may be selected as the particular separation trench 350', which is used to divide the 3D memory array 700-a into the first sub-array 700-a1 and the second sub-array 700-a2. In some examples, the particular separation trench 350' may be subjected to a further etch operation so that the two sub-arrays on both sides of the particular separation trench 350' are separated completely. In some examples, during the subsequent processing steps, the particular separation trench 350' may be filled only with the insulative material or dielectric material, without any other material such as a storage element material or a conductive material formed therein. In some examples, a particular portion may be determined from the serpentine trench 350 as the separation trench 350' every certain number of word lines.

In addition to the forming method of the separation trench 350' (or the separation layer 350'), two other difference method may be used. In one example, a plurality of sub-arrays may be formed in a same substrate by the processing steps described with reference to FIG. 2A-5C, and wherein several separation layers 350' may be deposited on one or both side of a sub-array in an extending direction of the serpentine shaped trench 350 so that the plurality of sub-arrays are separated from each other electrically. In another example, after forming a 3D memory array as mentioned in the embodiments described with reference to FIGS. 5A-5C, according to the dimension of the memory array, a certain number of separation trenches 350' may be formed along a plane parallel to both a digit line and a word line to cut the memory array into a plurality of sub-arrays, and wherein an etch operation may be performed on the memory array to form the separation trenches 350'.

Figure 8:
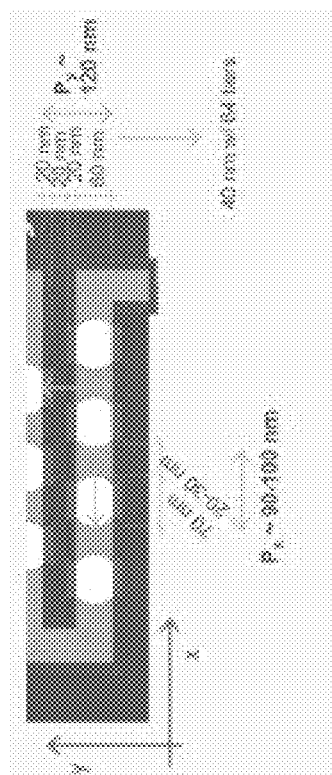
FIG. 8 illustrates exemplary dimensions related to an example 3D memory array in accordance with example as disclosed herein.

FIGS. 7B and 7C illustrate that a position where a particular trench 350' (or a separation layer 350') is formed may be adjusted according to the dimension of 3D memory array. For example, a cross-sectional area of the memory array shown in FIG. 7B may be 120 um×120 um. When the 3D memory array is formed based on example pitches (e.g., a pitch of about 100 nm in x direction and a pitch of about 100 nm in y direction) of adjacent pillars shown in FIG. 8 illustrating exemplary dimensions related to an example 3D memory array in accordance with example as disclosed herein, the 3D memory array may contain 1024×1024 pillars. In this case, eight separation layers 350' may be formed in the 3D memory array to divide the 3D memory array into eight portions, each of which may contain 1024×128 pillars.

In some examples, because of the insertion of the separation layers 350', the corresponding capacitance value may drop down to 2 pF, and the first order computation of the energy ($\frac{1}{2}CV^2$) needed to charge the word line is about 15 pF/bit. In addition, the dividing of the 3D memory array on pillars thereof may allow the decoding circuitry under array (CuA) optimization, for example minimizing the number of pillar decoders, sense amplifier or the like, while SCM requirements can be met due to the memory array segmentation at a higher level (i.e., the word line cutting due to the insertion of the separation layers).

In some examples, depending on the decoding optimization, the pillars 580 may be coupled to a plurality of selectors positioned at a top, a bottom, or both a top and a bottom (e.g., below or above the plurality of word line plates) of the 3D memory arrays. Spatially related terms, including but not limited to, "top," "bottom," "lower," "upper," "beneath," "below," "above," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Figure 9:
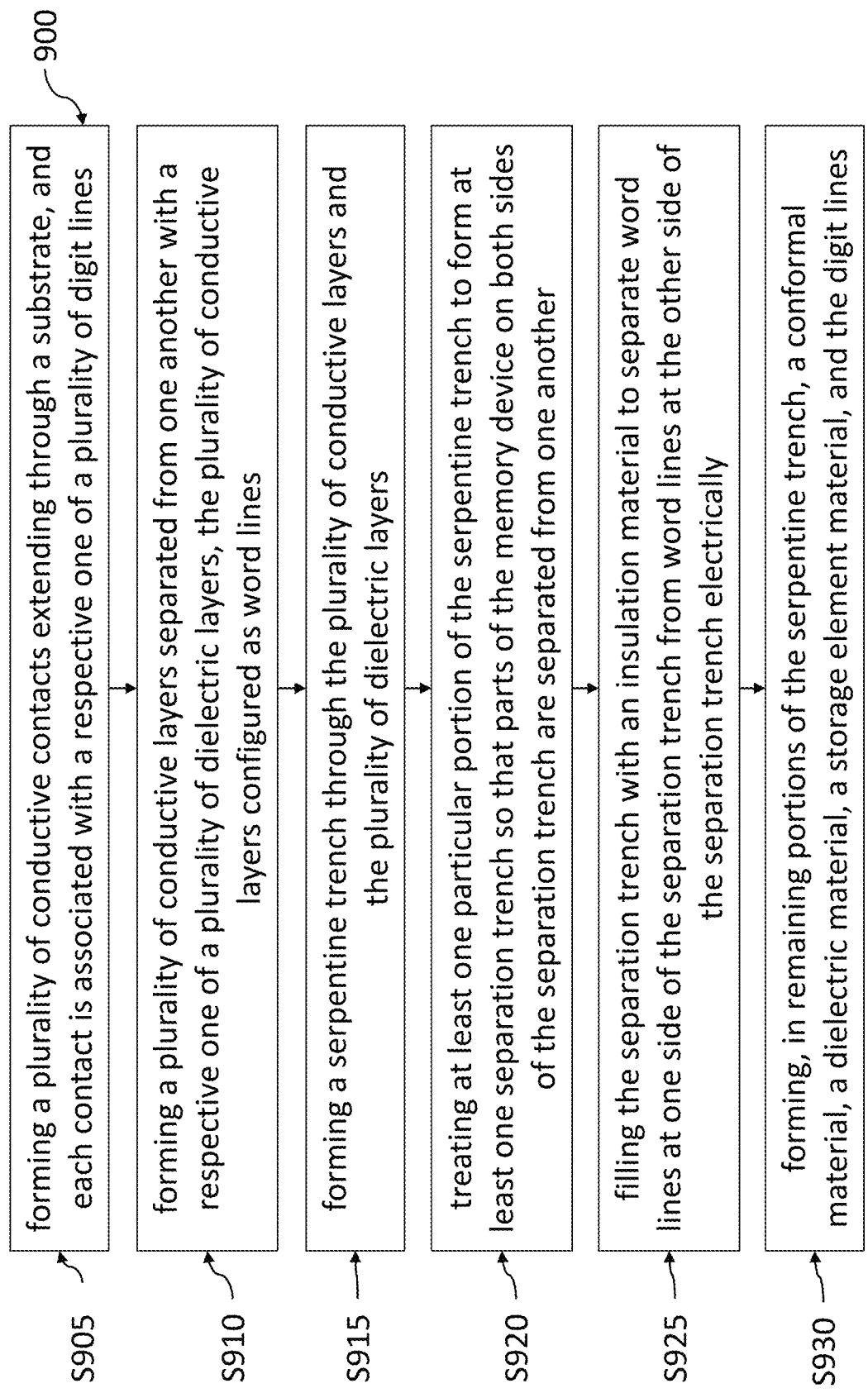
FIG. 9 shows a flowchart illustrating a method of manufacturing a 3D memory array in accordance with examples as disclosed herein.

FIG. 9 shows a flowchart illustrating a method 900 for manufacturing a 3D memory array in accordance with aspects of the present disclosure. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At S905, the method 900 may include forming a plurality of conductive contacts extending through a substrate, and each contact is associated with a respective one of a plurality of digit lines. The operations of S905 may be performed according to the method described herein.

At S910, the method 900 may include forming a plurality of conductive layers separated from one another with a respective one of a plurality of dielectric layers, and wherein the plurality of conductive layers is configured as word lines. The operations of S910 may be performed according to the method described herein.

At S915, the method 900 may include forming a serpentine trench through the plurality of conductive layers and the plurality of dielectric layers, the serpentine trench exposing the substrate and dividing the plurality of conductive layers into a first set of word lines and a second set of word lines. The operations of S915 may be performed according to the method described herein.

At S920, the method 900 may include treating at least one particular portion of the serpentine trench to form at least one separation trench so that parts of the memory array on both sides of the at least one separation trench are separated from one another. The operations of S920 may be performed according to the method described herein.

At S925, the method 900 may include filling the at least one separation trench with an insulation material to separate word lines at one side of the at least one separation trench from word lines at the other side of the at least one separation trench electrically. The operations of S925 may be performed according to the method described herein.

At S930, the method 900 may include forming, in remaining portions of the serpentine trench, a conformal material, a dielectric material, a storage element material, and the digit lines so that a respective storage element is surrounded by a respective word line, a respective digit line, the conformal material, and respective dielectric layers. The operations of S930 may be performed according to the method described herein.

Furthermore, the step of forming, in remaining portions of the serpentine trench, a conformal material, a dielectric material, a storage element material, and the digit lines may further comprise depositing the conformal material in remaining portions of the serpentine trench, depositing the dielectric material on the conformal material, forming an opening over a respective conductive contact by etching a portion of the conformal material and the dielectric material, depositing the storage element material into the opening, treating the storage element material so that sidewalls of the plurality of dielectric layers and the storage element material are coplanar, and depositing a conductive material into the opening to form the digit line.

In some examples, an apparatus as described herein may perform a method, such as the method 900. The apparatus may include features, means, or instructions (e.g., a non-transitory computer-readable medium storing instructions executable by a processor) for forming a plurality of conductive contacts extending through a substrate, and each contact is associated with a respective one of a plurality of digit lines.

Some examples of the apparatus described herein may further include operations, features, means, or instructions for forming a plurality of conductive layers separated from one another with a respective one of a plurality of dielectric layers, and wherein the plurality of conductive layers is configured as word lines.

Some examples of the apparatus described herein may further include operations, features, means, or instructions for forming a serpentine trench through the plurality of conductive layers and the plurality of dielectric layers, the serpentine trench exposing the substrate and dividing the plurality of conductive layers into a first set of word lines and a second set of word lines.

Some examples of the apparatus described herein may further include operations, features, means, or instructions for treating at least one particular portion of the serpentine trench to form at least one separation trench so that parts of the memory array on both sides of the at least one separation trench are separated from one another.

Some examples of the apparatus described herein may further include operations, features, means, or instructions for filling the at least one separation trench with an insulation material to separate word lines at one side of the at least one separation trench from word lines at the other side of the at least one separation trench electrically.

Some examples of the apparatus described herein may further include operations, features, means, or instructions for forming, in remaining portions of the serpentine trench, a conformal material, a dielectric material, a storage element material, and the digit lines so that a respective storage element is surrounded by a respective word line, a respective digit line, the conformal material, and respective dielectric layers.

Some examples of the apparatus described herein may further include operations, features, means, or instructions for depositing the conformal material in remaining portions of the serpentine trench, depositing the dielectric material on the conformal material, forming an opening over a respective conductive contact by etching a portion of the conformal material and the dielectric material, depositing the storage element material into the opening, treating the storage element material so that sidewalls of the plurality of dielectric layers and the storage element material are coplanar, and depositing a conductive material into the opening to form the digit line.

Figure 10:
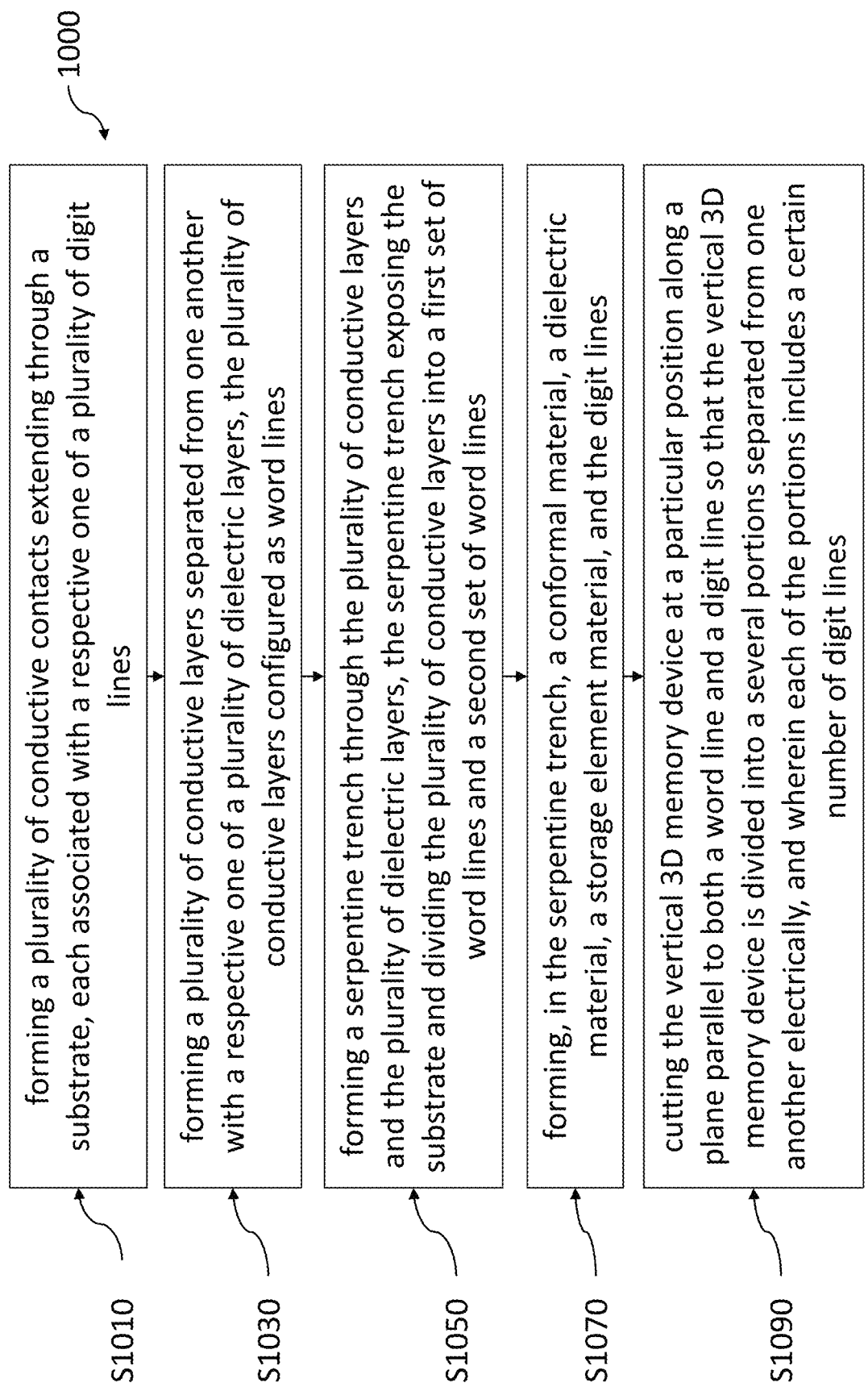
FIG. 10 shows a flowchart illustrating a method of manufacturing a 3D memory array in accordance with examples as disclosed herein.

FIG. 10 shows a flowchart illustrating a method 1000 for manufacturing a 3D memory array in accordance with aspects of the present disclosure. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At S1010, the method 1000 may include forming a plurality of conductive contacts extending through a substrate, and wherein each conductive contract is associated with a respective one of a plurality of digit lines. The operations of S1010 may be performed according to the method described herein.

At S1030, the method 1000 may include forming a plurality of conductive layers separated from one another with a respective one of a plurality of dielectric layers, and wherein the plurality of conductive layers is configured as word lines. The operations of S1030 may be performed according to the method described herein.

At S1050, the method 1000 may include forming a serpentine trench through the plurality of conductive layers and the plurality of dielectric layers, the serpentine trench exposing the substrate and dividing the plurality of conductive layers into a first set of word lines and a second set of word lines. The operations of S1050 may be performed according to the method described herein.

At S1070, the method 1000 may include forming, in the serpentine trench, a conformal material, a dielectric material, a storage element material, and the digit lines so that a respective storage element is surrounded by a respective word line, a respective digit line, the conformal material, and respective dielectric layers. The operations of S1070 may be performed according to the method described herein.

At S1090, the method 1000 may include cutting the vertical 3D memory array at a particular position along a plane parallel to both a word line and a digit line so that the vertical 3D memory array is divided into a several portions separated from one another electrically, and wherein each of the portions includes a certain number of digit lines. The operations of S1090 may be performed according to the method described herein.

Furthermore, the step of forming, in the serpentine trench, a conformal material, a dielectric material, a storage element material, and the digit lines may comprise depositing the conformal material in the serpentine trench, depositing the dielectric material on the conformal layer, forming an opening over a respective conductive contact by etching a portion of the conformal material and the dielectric material, depositing the storage element material into the opening, treating the storage element material so that sidewalls of the plurality of dielectric layers and the storage element material are coplanar, and depositing a conductive material into the opening to form the digit line.

It should be noted that the methods described above describe possible implementations, and that the operations and the steps may be rearranged or otherwise modified and that other implementations are possible. Furthermore, portions from two or more of the methods may be combined.

Figure 11:
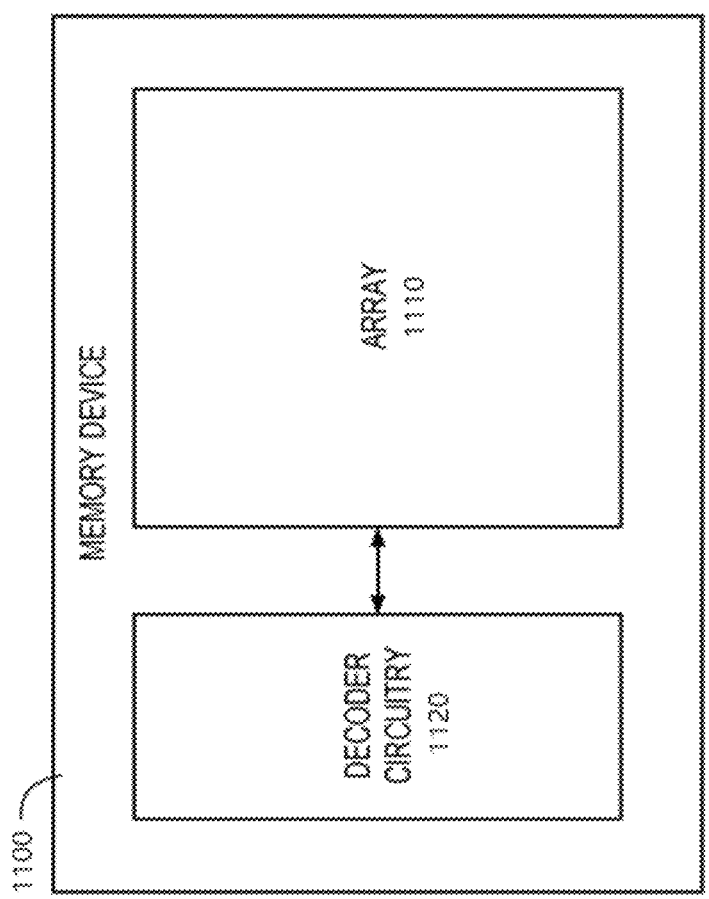
FIG. 11 is a block diagram of an apparatus in the form of a memory device in accordance with examples as disclosed herein.

FIG. 11 is a block diagram of an apparatus in the form of a memory device 1100 in accordance with examples as disclosed herein. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 11, the memory device 1100 can include a 3D memory array 1110. The 3D memory array 1110 can be analogous the 3D memory array 200, 600, and/or 700 previously described in connection with FIGS. 5B, 6B, and 7A, respectively. Although FIG. 11 shows a single 3D memory array 1110 for clarity and so as not to obscure embodiments of the present disclosure, the memory device 1100 may include any number of the 3D memory array 1110.

As shown in FIG. 11, the memory device 1100 can include decoding circuitry 1120 coupled to the 3D memory array 1110. The decoding circuitry 1120 can be included on the same physical device (e.g., the same die) as the 3D memory array 1110. The decoding circuitry 1120 can be included on a separate physical device that is communicatively coupled to the physical device that includes the 3D memory array 1110.

The decoding circuitry 1120 can receive and decode address signals to access the memory cells as mentioned above with reference to FIG. 1 of the 3D memory array 1110 during program and/or sense operations performed on the 3D memory array 1110. For example, the decoding circuitry 1120 can include portions of decoder circuitry for use in selecting a particular memory cell of the 3D memory array 1110 to access during a program or sense operation. For instance, a first portion of the decoder circuitry can be used to select a word line and a second portion of the decoder circuitry can be used to select a digit line.

The embodiment illustrated in FIG. 11 can include additional circuitry, logic, and/or components not illustrated so as not to obscure embodiments of the present disclosure. For example, the memory device 1100 can include a controller to send commands to perform operation on the 3D memory array 1110, such as operations to sense (e.g., read), program (e.g., write), move, and/or erase data, among other operations. Further, the memory device 1100 can include address circuitry to latch address signals provided over input/output (I/O) connectors through I/O circuitry. Further, the memory device 1100 can include a main memory, such as, for instance, a DRAM or SDRAM, that is separate from and/or in addition to the memory array 1110.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A vertical 3D memory device, comprising:
   a substrate including a plurality of conductive contacts each coupled with a respective one of a plurality of digit lines;
   a plurality of word line plates separated from one another with respective dielectric layers on the substrate, the plurality of word line plates including at least a first set of word lines separated from at least a second set of word lines with a dielectric material extending in a serpentine shape and at least a third set of word lines separated from at least a fourth set of word lines with a dielectric material extending in a serpentine shape;
   at least one separation layer separating the first set of word lines and the second set of word lines from the third set of word lines and the fourth set of word lines, wherein the at least one separation layer is parallel to both a digit line and a word line; and
   a plurality of storage elements each formed in a respective one of a plurality of recesses such that a respective storage element is surrounded by a respective word line, a respective digit line, respective dielectric layers, and a conformal material formed on a sidewall of a word line facing a respective digit line.

2. The vertical 3D memory device of claim 1, wherein the at least one separation layer includes an insulation material.

3. The vertical 3D memory device of claim 2, wherein the insulation material is a dielectric material.

4. The vertical 3D memory device of claim 1, wherein the at least one separation layer is configured to separate the first set of word lines and the second set of word lines from the third set of word lines and the fourth set of word lines electrically.

5. The vertical 3D memory device of claim 1, wherein a thickness of the at least one separation layer is same as a thickness of a dielectric material in which the digit line is formed.

6. The vertical 3D memory device of claim 1, wherein the at least one separation layer is configured to divide the memory device into several portions so that each portion includes a certain number of the digit lines.

7. The vertical 3D memory device of claim 6, wherein the at least one separation layer is associated with a certain number of the word lines.

8. The vertical 3D memory device of claim 1, wherein the plurality of conductive contacts is arranged in a staggered pattern.

9. The vertical 3D memory device of claim 1, wherein the plurality of conductive contacts is arranged in a grid pattern.

10. The vertical 3D memory device of claim 1, further comprising circuitry configured to select a respective word line and a respective digit line during a program operation or sense operation performed on the vertical 3D memory device.

11. A method of manufacturing a vertical 3D memory array, comprising:
    forming a plurality of conductive contacts extending through a substrate, each associated with a respective one of a plurality of digit lines;
    forming a plurality of conductive layers separated from one another with a respective one of a plurality of dielectric layers, the plurality of conductive layers configured as word lines;
    forming a serpentine trench through the plurality of conductive layers and the plurality of dielectric layers, the serpentine trench exposing the substrate and dividing the plurality of conductive layers into a first set of word lines and a second set of word lines;
    treating at least one particular portion of the serpentine trench to form at least one separation trench so that parts of the memory array on both sides of the at least one separation trench are separated from one another;
    filling the at least one separation trench with an insulation material to separate word lines at one side of the at least one separation trench from word lines at the other side of the at least one separation trench electrically; and
    forming, in remaining portions of the serpentine trench, a conformal material, a dielectric material, a storage element material, and the digit lines so that a respective storage element is surrounded by a respective word line, a respective digit line, the conformal material, and respective dielectric layers.

12. The method of claim 11, further comprising, in forming, in remaining portions of the serpentine trench, the conformal material, the dielectric material, the storage element material, and the digit lines:
    depositing the conformal material in remaining portions of the serpentine trench;
    depositing the dielectric material on the conformal material;
    forming an opening over a respective conductive contact by etching a portion of the conformal material and the dielectric material;
    depositing the storage element material into the opening;
    treating the storage element material so that sidewalls of the plurality of dielectric-layers and the storage element material are coplanar; and
    depositing a conductive material into the opening to form the digit line.

13. The method of claim 11, wherein the at least one separation trench filled with the insulation material is configured to divide the memory array into several portions so that each portion includes a certain number of the digit lines.

14. The method of claim 13, wherein the at least one separation trench filled with the insulation material is associated with a certain number of the word lines.

15. The method of claim 11, wherein the insulation material is a dielectric material.

16. The method of claim 11, wherein each of the plurality of conductive contacts is electrically coupled with a respective one of the plurality of digit lines.

17. The method of claim 11, wherein the plurality of conductive contacts is arranged in a staggered pattern.

18. The method of claim 11, wherein the plurality of conductive contacts is arranged in a grid pattern.

19. A method of manufacturing a vertical 3D memory array, comprising:
- forming a plurality of conductive contacts extending through a substrate, each associated with a respective one of a plurality of digit lines;
- forming a plurality of conductive layers separated from one another with a respective one of a plurality of dielectric layers, the plurality of conductive layers configured as word lines;
- forming a serpentine trench through the plurality of conductive layers and the plurality of dielectric layers, the trench exposing the substrate and dividing the plurality of conductive layers into a first set of word lines and a second set of word lines;
- forming, in the serpentine trench, a conformal material, a dielectric material, a storage element material, and the digit lines so that a respective storage element is surrounded by a respective word line, a respective digit line, the conformal material, and respective dielectric layers; and
- cutting the memory array at a particular position along a plane parallel to both a word line and a digit line so that the memory array is divided into a several portions separated from one another electrically, wherein each of the portions includes a certain number of digit lines.

20. The method of claim 19, further comprising, in forming, in the serpentine trench, a conformal material, a dielectric material, a storage element material, and the digit lines:
- depositing the conformal material in the serpentine trench;
- depositing the dielectric material on the conformal material;
- forming an opening over a respective conductive contact by etching a portion of the conformal material and the dielectric material;
- depositing the storage element material into the opening;
- treating the storage element material so that sidewalls of the plurality of dielectric layers and the storage element material are coplanar; and
- depositing a conductive material into the opening to form the digit line.

* * * * *